(12) United States Patent
Inoue

(10) Patent No.: US 11,031,278 B2
(45) Date of Patent: Jun. 8, 2021

(54) SUCTION MEMBER

(71) Applicant: KYOCERA Corporation, Kyoto (JP)

(72) Inventor: Tetsuya Inoue, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 370 days.

(21) Appl. No.: 16/089,697

(22) PCT Filed: Mar. 29, 2017

(86) PCT No.: PCT/JP2017/013008
§ 371 (c)(1),
(2) Date: Sep. 28, 2018

(87) PCT Pub. No.: WO2017/170738
PCT Pub. Date: Oct. 5, 2017

(65) Prior Publication Data
US 2019/0115244 A1  Apr. 18, 2019

(30) Foreign Application Priority Data

Mar. 30, 2016  (JP) .............................. JP2016-067850

(51) Int. Cl.
| | | |
|---|---|---|
| *H01L 21/687* | (2006.01) | |
| *G03F 7/20* | (2006.01) | |
| *H01L 21/683* | (2006.01) | |
| *H01L 21/67* | (2006.01) | |

(52) U.S. Cl.
CPC ............ *H01L 21/6875* (2013.01); *G03F 7/20* (2013.01); *H01L 21/67092* (2013.01); *H01L 21/683* (2013.01); *H01L 21/68757* (2013.01)

(58) Field of Classification Search
CPC ....... B25B 11/00; B25B 11/005; B25B 11/02; H01L 21/6875; H01L 21/683; H01L 21/68757
See application file for complete search history.

(56) References Cited

U.S. PATENT DOCUMENTS

| 4,143,441 A | * | 3/1979 | Brooks | ..................... A47L 9/02 15/369 |
|---|---|---|---|---|
| 2005/0066471 A1 | * | 3/2005 | Miller | ....................... A47L 9/02 15/401 |
| 2008/0159835 A1 | | 7/2008 | Kwon | |
| 2009/0233443 A1 | | 9/2009 | Sasaki | |
| 2015/0311108 A1 | | 10/2015 | Horiuchi | |
| 2019/0115244 A1 | * | 4/2019 | Inoue | .................... H01L 21/683 |

FOREIGN PATENT DOCUMENTS

| JP | H10-92738 A | 4/1998 |
|---|---|---|
| JP | H10-242255 A | 9/1998 |
| JP | 2012-119378 A | 6/2012 |
| JP | 2015-165528 A | 9/2015 |
| KR | 20130041543 A | 4/2013 |
| WO | 2014/084060 A1 | 6/2014 |

* cited by examiner

*Primary Examiner* — Lee D Wilson
(74) *Attorney, Agent, or Firm* — Procopio Cory Hargreaves and Savitch LLP

(57) ABSTRACT

A suction member includes a base part (3) and a plurality of protrusions (2). The base part (3) includes a first surface (4). Each of the protrusions (2) includes a side surface (6) contiguous to the first surface (4) and a top surface (5) contiguous to the side surface (6). The side surface (6) has a plurality of projecting ridges (7) extending in a direction apart from the first surface (4).

14 Claims, 9 Drawing Sheets

SUCTION MEMBER

TECHNICAL FIELD

The present disclosure relates to a suction member for sucking and holding a workplace to be sucked.

BACKGROUND ART

A suction member for sucking and holding a substrate such as a silicon semiconductor substrate has been widely used in a process for fabricating a semiconductor device. In holding a substrate, there arises the problem of the adhesion of particles produced by friction between the substrate and the suction member, a flaw on the suction member, or particles intruding into a pore onto the substrate. In an exposure process, for example, if particles are held between the reverse of the substrate and the contact surface of the suction member, the substrate locally raises, thereby leading to defocusing of exposure, so as to degrade a circuit pattern formed on the substrate. In order to suppress a reduced yield caused by the degradation, a suction member having a plurality of protrusions formed on a main surface, the top of each of the protrusions being a contact surface with the substrate, has been used.

Japanese Unexamined Patent Publication No. H10-242255, for example, discloses a suction member having a plurality of tapered protrusions formed by shot-blasting the surface of a ceramic substrate.

Moreover, Japanese Unexamined Patent Publication No. H10-92738 discloses a suction member having protrusions obtained by forming a surface layer on a substrate made of sintered silicon carbide in a predetermined thickness by chemical vapor deposition (CVD) and removing portions out of contact with the substrate by a laser.

Additionally, Japanese Unexamined Patent Publication No. 2012-119378 discloses a suction member having a plurality of protrusions formed by irradiating a ceramic substrate with a laser beam.

SUMMARY OF THE INVENTION

A suction member according to the present disclosure includes a base part and a plurality of protrusions. The base part has a first surface. Each of the protrusions has a side surface contiguous to the first surface and a top surface contiguous to the side surface. The side surface has a plurality of projecting ridges extending apart from the first surface.

BRIEF DESCRIPTION OF THE DRAWINGS

FIGS. 2(a) and 2(b) are views showing one example of a protrusion in the suction member according to the present disclosure, wherein FIG. 2(a) is a cross-sectional view showing the neighborhood of the protrusion and FIG. 2(b) is a plan view schematically showing the neighborhood of the protrusion.

FIGS. 7(a) and 7(b) are views showing the shape of the protrusion when the suction member according to the present disclosure is fabricated, wherein FIG. 7(a) shows a state after a first machining process and FIG. 7(b) shows a state after a second machining process.

EMBODIMENTS FOR CARRYING OUT THE INVENTION

Figure 1:
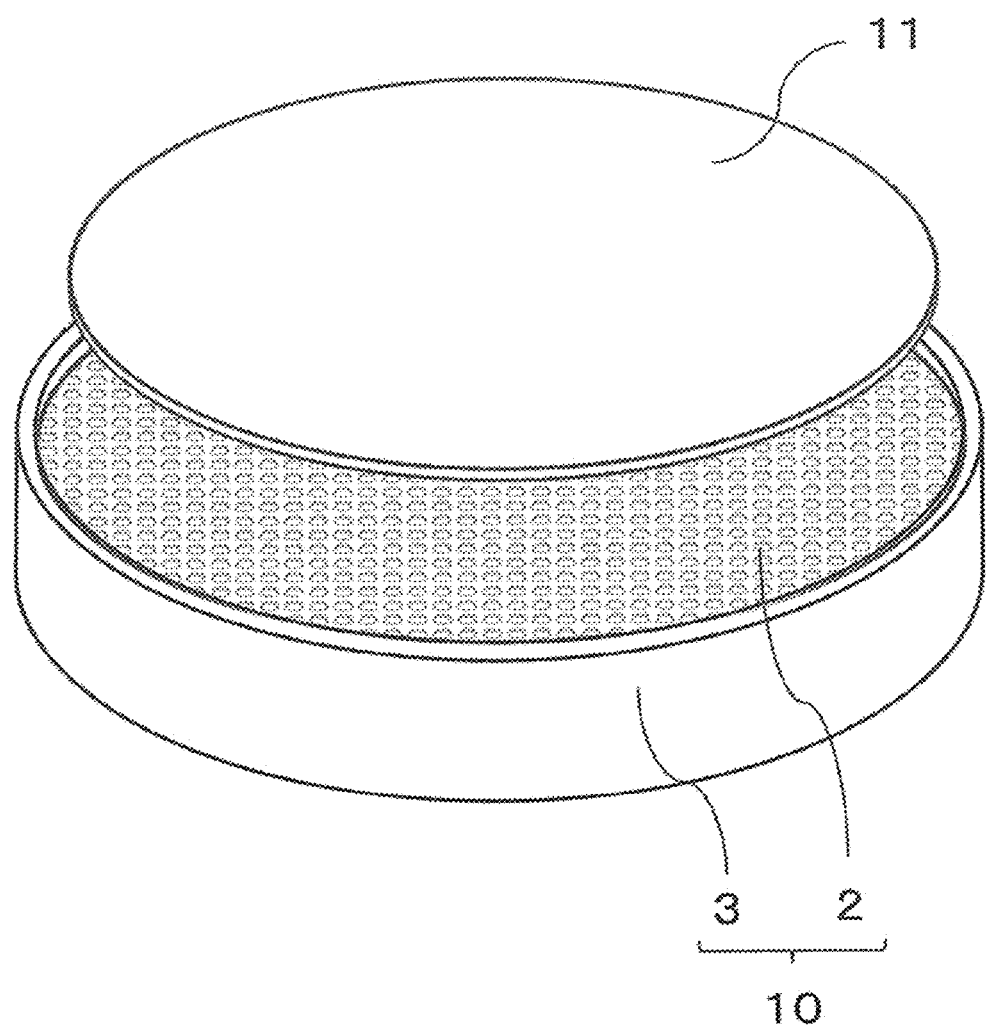
FIG. 1 is a perspective view schematically showing a suction member and a substrate that is a workplace to be sucked in the present disclosure.
Figure 2A:
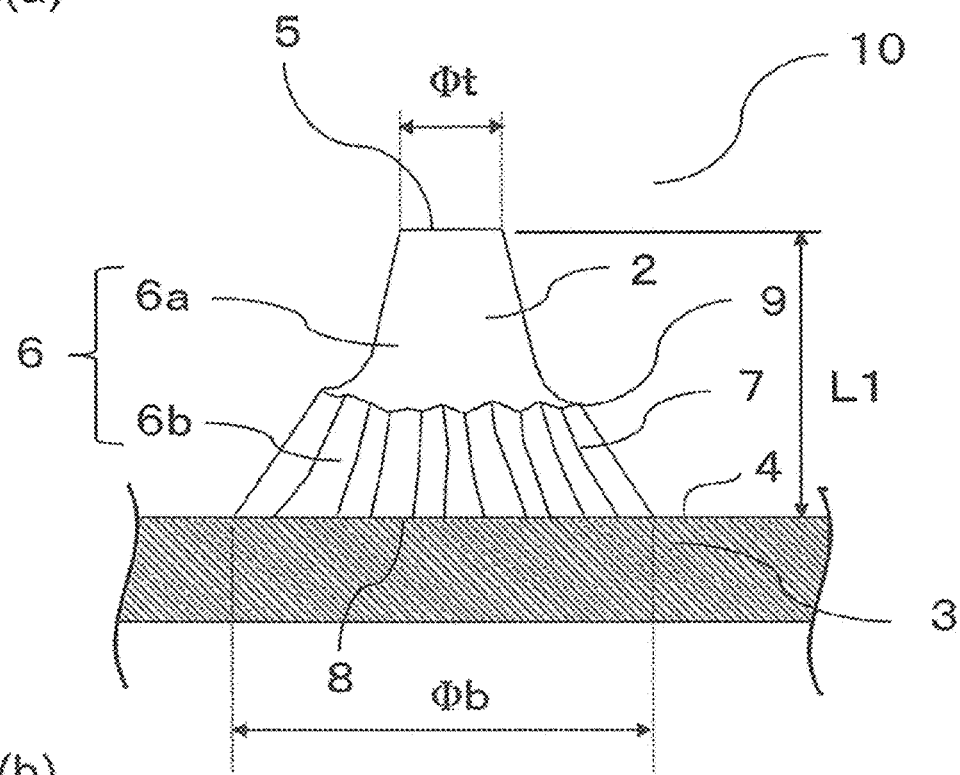
Figure 2B:
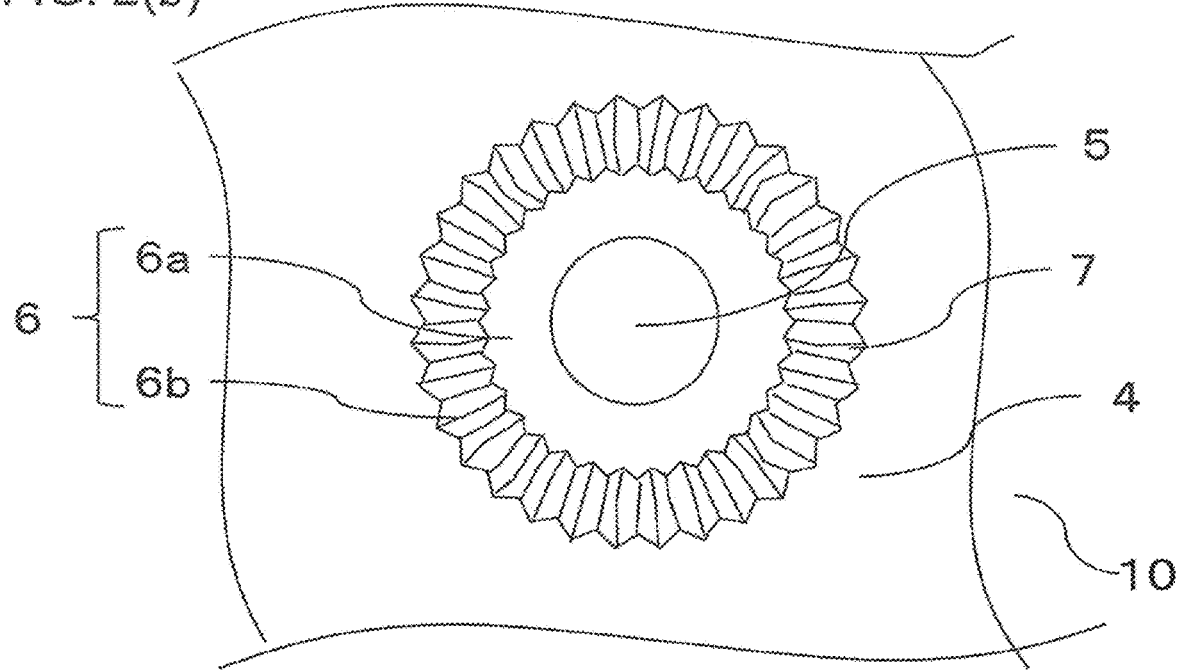
Figure 3:
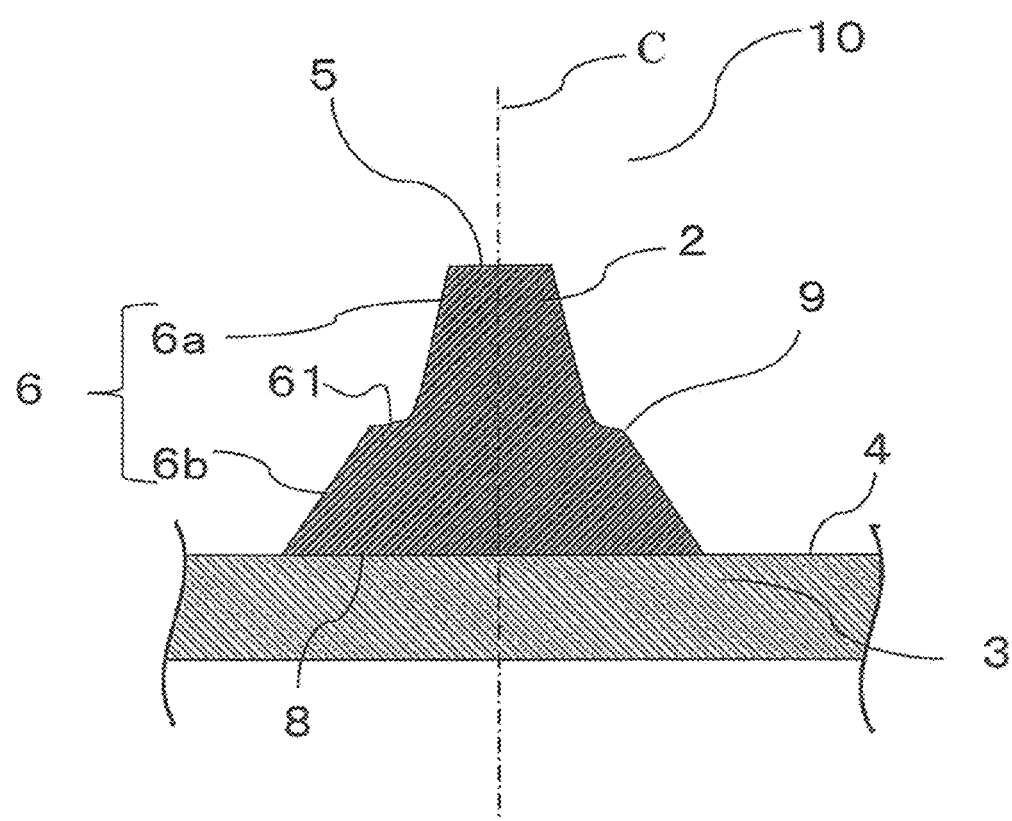
FIG. 3 is a cross-sectional view showing the protrusion along a center line in the suction member according to the present disclosure.

A description will be given of a suction member according to the present disclosure with reference to the attached drawings. FIG. 1 is a perspective view schematically showing a suction member 10 and a substrate 11 that is a workpiece to be sucked in the present embodiment. FIGS. 2(a) and 2(b) are views showing a protrusion 2 in the suction member 10, wherein FIG. 2(a) is a cross-sectional view showing the neighborhood of the protrusion 2 and FIG. 2(b) is a plan view schematically showing the neighborhood of the protrusion 2. FIG. 3 is a cross-sectional view showing the protrusion 2 along a center line in the suction member 10 shown in FIGS. 2(a) and 2(b).

The suction member 10 having these protrusions 2 requires a relatively high mechanical strength of the protrusion 2 in spite of little adhesion of particles to the workpiece 11 to be sucked from the protrusion 2.

The suction member 10 according to the present disclosure includes a base part 3 and the plurality of protrusions 2. The base part 3 has a first surface 4. Each of the protrusions 2 has a side surface 6 contiguous to the first surface 4 and a tops surface 5 contiguous to the side surface 6. The side surface 6 has a plurality of projecting ridges 7, each of which extends apart from the first surface 4.

The base part 3 is formed into a substantially disk-like shape, and has the first surface 4 as an obverse and a second surface opposite to the first surface. The protrusions 2 project from the first surface 4. A flute may be formed at the root of each of the protrusions 2 at the first, surface 4. The first surface 4 includes the flute.

The protrusion 2 is formed into a substantially truncated cone having a diameter that becomes smaller toward the top surface 5. The top surface 5 serves as a contact surface with the workpiece 11 to be sucked serving as the substrate 11. In this manner, the area of a contact between the suction member 10 and the workpiece 11 to be sucked becomes smaller. Since the area of the contact is relatively small, few particles are produced when the workpiece 11 to be sucked is sucked, and furthermore, relatively fewer particles adhere to the workpiece 11 to be sucked. Moreover, the projecting ridges 7 function as beams for enhancing the flexural rigidity of the protrusion 2, and thus, the mechanical strength of the protrusion 2 becomes relatively higher. More specifically, the protrusion 2 has the top surface 5 whose area is relatively small, and it has a relatively high mechanical strength. In addition, in the suction member 10, since the projecting ridges 7 are formed on the side surface 6 of the protrusion 2, the surface area of the protrusion 2 becomes relatively greater. Consequently, it is possible to suppress an increase in temperature of the suction member 10 caused by an increase in temperature of the workpiece 11 to be sucked, and furthermore, to suppress a partial fluctuation in temperature of the suction member 10 per se. About ten to a hundred, for example, of projecting ridges 7 are formed on the side surface 6 of each of the protrusions 2. As the number of projecting ridges 7 increases, the surface area of the protrusion 2 becomes greater, thus improving heat dissipation property and increasing the mechanical strength.

As shown in FIGS. 2(a) and 2(b), the projecting ridges 7 may be contiguous to the first surface 4. With this configuration, the strength of the root of the protrusion 2 can be particularly increased.

In the protrusion 2, the area of the top surface 5 may be smaller than the area of the protrusion 2 at a position contiguous to the first surface 4. In the suction member 10 according to the present disclosure, the protrusions 2 are formed integrally with the base part 3. Since the area of the top surface 3 is smaller than the area of the protrusion 2 at a position contiguous to the first surface 4 in the suction member 10, particles hardly adhere near the intersection between the top surface 5 and the side surface 6. Moreover, the protrusion 2 has a greater diameter at the root thereof than that of the top surface 5, and therefore, it is possible to suppress the breakage of the protrusion 2 near the root thereof even in the case where an external force is exerted on the protrusion 2.

FIG. 3 is the cross-sectional view showing the protrusion 2 in the suction member 10 shown in FIG. 1, the protrusion 2 being cut along a center line.

At the side surface 6, a portion extending from the top surface 5 to the projecting ridges 7 is referred to as a first side surface 6a, and furthermore, a portion at which the projecting ridges 7 are located is referred to as a second side surface 6b. At this time, in a side view of the protrusion 2, the width of the first side surface 6a is greatest at a boundary 9 between the first side surface 6a and the second side surface 6b. The width of the second side surface 6b may be greater than that of the boundary.

Here, the portion from the top surface 5 to the projecting ridges 7 is referred to as a region from the top surface 5 to the upper ends of the projecting ridges 7, and thus, it excludes the projecting ridges 7.

At the second side surface 6b serving as the root of the protrusion 2 nearer the first surface 4 than the boundary 9, its cross-sectional area parallel to the first surface 4 is relatively great, and therefore, its mechanical strength is relatively great. At the first side surface 6a nearer the top surface 5 than the boundary 9, its cross-sectional area becomes smaller apart from the boundary 9, and therefore, the area of the side surface 6 near the workpiece 11 to be sucked is relatively smaller.

Moreover, the first side surface 6a may be provided with a step 61 at a portion contiguous to the second side surface 6b. In this manner, the formation of the step 61 abruptly reduces the cross-sectional area of the protrusion 2 near the boundary 9 toward the top surface 5. The formation of the step 61 in the above-described manner enlarges the difference between an area 8 of a portion contiguous to the first surface of the protrusion 2 and the area of the top surface 5 so as to further reduce the top surface 5. Here, the step 61 has an angle of, for example, 0° or more and 15° or less with respect to the first surface 4.

Additionally, in a side view of the protrusion 2, the width of the first side surface 6a may be gradually reduced toward the top surface 5. The above-described first side surface 6a hardly has surplus unevenness. Therefore, particles hardly adhere, and furthermore, the area (the area of contact) of the top surface 5 is small.

Moreover, in a side view of the protrusion 2, the width of the second side surface 6b may be gradually increased toward the first surface 4. The above-described second side surface 6b hardly has surplus unevenness, and therefore, particles hardly adhere, and furthermore, the area of the portion of the protrusion 2 contiguous to the first surface 4 is great enough to improve the mechanical strength.

From the viewpoint of the sufficient suppression of the adhesion of particles as well as the achievement of the satisfactory mechanical strength, the height L1 of the protrusion 2 is preferably about one to three times as great as the diameter Φt of the top surface 5 of the protrusion 2. The boundary between the protrusion 2 and the base part 3 may be rounded.

In the case where the suction member 10 is used as a vacuum chuck for sucking the workpiece 11 to be sucked that is placed on the protrusions 2 in a vacuum, vacuum responsiveness when the workpiece 11 to be sucked is sucked in a vacuum (a response speed after the workpiece to be sucked is placed on the suction member until it is sucked in a vacuum) can be relatively increased by increasing the height of the protrusion 2. From the viewpoint of a favorable vacuum responsiveness when the workpiece 11 to be sucked is sucked in a vacuum, the diameter Φt of the top surface 5 of the protrusion 2 may be 200 μm or less, more preferably, 100 μm or less, and furthermore, the height L may be 100 μm or more, more preferably, 300 μm or more.

In addition, the number of pores at the first side surface 6a per unit area may be smaller than that of the second side surface 6b per unit area. Particles are liable to be produced or adhere at pores staying at the side surface 6. In the case where the number of pores at the first side surface 6a per unit area nearer the top surface 5 is relatively small, it is possible to reduce the production of particles.

The number of pores at each of the first side surface 6a and the second side surface 6b per unit area is measured at a magnification of 500 times within a range of a lateral length of 0.25 mm and a vertical length of 0.20 mm at an area of 0.05 mm$^2$ by using a scanning type electron microscope.

Furthermore, the protrusion 2 may have the projecting ridges 7 only at the second side surface 6b nearer the first surface 4 than the boundary 9. Since the suction member 10 has the projecting ridges 7 only at the second side surface 6b apart from the workpiece 11 to be sucked, particles adhering to the projecting ridges 7 hardly reach the workpiece 11 to be sucked, thus suppressing the adhesion of the particles to the workpiece 11 to be sucked.

Vacuum deposition or a Johnson-Rahbeck force-type electrostatic suction is preferably used as a method for sucking and holding the workpiece 11 to be sucked by using the suction member 10.

The base part 3 and the protrusions 2 may be made of ceramic. The suction member 10 is desirably high in rigidity, hardness, and strength. The suction member 10 may be made of ceramic containing mainly cordierite, zirconia, alumina, silicon nitride, aluminum nitride, or silicon carbide. In particular, it is preferable that the suction member 10 be made of silicon carbide ceramic.

Hereinafter, ceramic containing mainly silicon carbide is referred to as silicon carbide ceramic. Silicon carbide ceramic is high in heat conductivity and excellent in heat dissipation property, and therefore, the temperature of the workpiece 11 to be sucked hardly changes. Moreover, silicon carbide ceramic has electrical conduction, thereby seldom producing static electricity. Consequently, particles hardly electrostatically adhere to the suction member 10. Here, the main component is referred to as a component occupying 50 mass % or more out of 100 mass % of all components configuring a target member. Particularly preferably, 90 mass % or more of silicon carbide is contained.

In the case where the suction member 10 is made of silicon carbide ceramic, the total ratio of 3C type and 4H type in the crystalline polymorphism of silicon carbide crystals may be 10% or more or 20% or less. When the crystalline polymorphism of silicon carbide crystals and a relative density fall within this range, a volume resistivity can be set to $1\times10^5 \Omega \cdot m$ or more and $5\times10^6 \Omega \cdot m$ or less. In this manner, the speed of elimination of the static electricity decreases, thus further reducing a possibility of abrupt occurrence of an electric discharging phenomenon so as to suppress an electrostatic fracture.

In terms of the quantification of crystalline polymorphism. X-ray diffraction is carried out by using an X-ray diffractometer, and then, the resultant spectrum is subjected to a RUSKA method.

The relative density may be 96.5% or more. The use of this fine ceramic can reduce pores. The relative density of silicon carbide ceramic is simply determined in conformity with JIS R 1634-1998.

In addition to silicon carbide as the main component, silicon carbide ceramic may contain boron, free carbon, iron, titanium, or the like. It is preferable that silicon carbide ceramic contain titanium whose content is 160 ppm by mass or more and 400 ppm by mass or less.

Out of 100 mass % of all of the components of silicon carbide ceramic, if the content of titanium exceeds the above-described limit, the volume resistivity can be set to $1\times10^4 \Omega \cdot m$ or more and $5\times10^6 \Omega \cdot m$ or less. In the case where the volume resistivity falls within this range, that is, within a so-called semiconducting property, it is possible to suppress the adhesion of particles to the top surface 5 caused by static electricity, and furthermore, the static electricity is gradually discharged, thus reducing a possibility of occurrence of an abrupt electric discharge phenomenon, so as to suppress electrostatic fracture.

The volume resistivity of silicon carbide ceramic is determined in conformity with JIS C 2141-1992. More specifically, as a sample of silicon carbide ceramic to be used in measuring a volume resistivity, a disk having a diameter of 50 mm and a thickness of 2.5 mm is cut from a base part. Electrodes made of silver are simply formed on both main surfaces of the sample. Thereafter, a volume resistivity is determined when an alternating voltage of 1 V is applied between the electrodes.

The content of titanium contained in silicon carbide ceramic can be determined by an ICP (Inductively Coupled Plasma) emission spectrometer. More specifically, a method for determining the content of titanium by the ICP emission spectrometer is as follows: a part of silicon carbide ceramic is pulverized in a carbide mortar in a previous process, and then, a boric acid and sodium carbonate are added into the resultant sample, followed by melting. Thereafter, the resultant sample is cooled and then dissolved in a hydrochloric acid, solution, and the solution is moved into a flask, followed by diluting with water to a reference line in a constant value and measuring by the ICP emission spectrometer together with a solution for a calibration curve. In this manner, the content of titanium contained in silicon carbide ceramic can be determined.

Each of the components is just identified by irradiating the silicon carbide ceramic with a CuKα beam by the use of an X-ray diffractometer. If the identified component is, for example, SiC or $B_4C$, the value of the content of Si or B obtained by the ICP emission spectrometer is converted into the value of SiC or $B_4C$.

It is preferable that the suction member 10 made of silicon carbide ceramic have, at the base part 3, a density of 3.18 $g/cm^3$ or more, a dynamic elasticity of 440 GPa or more, and a specific stiffness of 135 $GPa \cdot cm^3/g$ or more. The above-described suction member 10 can keep the flatness of the workpiece 11 to be sucked placed at the top surface 5 with high accuracy. Moreover, the suction member 10 has a heat conductivity of 150 W/(m·K) or more at room temperature. When the workpiece 11 to be sucked is locally heated, the heat can be discharged via the suction member 10. In this suction member 10, it is possible to suppress distortion caused by thermal expansion of the workpiece 11 to be sucked. As a consequence, it is possible to suppress degradation of exposure accuracy caused by heat generation in an exposure process. Here, the heat conductivity at room temperature is measured within the range from 15° C. to 30° C., more preferably, 22° C. to 24° C. In the suction member 10 made of silicon carbide ceramic, a heat conductivity of as high as 60 W/(m·K) or more can be kept even in the environment in excess of room temperature, for example, 600° C. or higher.

In order to enhance the mechanical strength and further reduce the particles, the average grain size of crystals of silicon carbide forming silicon carbide ceramic may range from 3 μm to 10 μm. If the average grain size is 3 μm or more, heat dissipation property becomes high, and thus, even with the use in environment in which temperature increases, the flatness of the workpiece 11 to be sucked placed there can be kept with high accuracy. Moreover, if the average grain size is 10 μm or less, mechanical strength and rigidity become high, and therefore, the flatness of the workpiece 11 to be sucked placed there can be kept with high accuracy. In addition, pores hardly remain between crystalline particles, so that the particles remaining in the pores hardly adhere to the workpiece to be sucked.

Here, the average grain size of crystals of silicon carbide is determined, as follows:

First, the first surface 4 of the base part 3 made of silicon carbide ceramic is subjected to grinding by the use of a grindstone made of diamond having a grain size number of F220 stated in, for example, JIS R 6001-1:2017 (ISO 8486-1:1996). Subsequently, the first surface 4 is polished such that the arithmetic mean roughness Ra defined by JIS B 0601:2013 (ISO 4287:1997) becomes 0.01 μm or less by diamond abrasive grains, each having a grain size of 1 μm to 3 μm by the use of a lap disk made of tin. Next, base part is soaked in a heated and melted solution containing sodium hydroxide and potassium nitrate in a mass ratio of 1:1 for 15 to 30 seconds, and then, the polished surface is etched. The etched surface is observed by the use of an optical microscope at a magnification of 500 times, and thus, the surface observed in average is used as an observed surface in the present embodiment. Here, the surface observed in average excludes regions in which large particles unobservable in other regions exist during observation. The size of the observed surface is 0.22 mm in lateral length and 0.16 mm in vertical length, and its area is 0.035 $mm^2$.

With a photo or an image obtained by picking the observed surface, three to five straight lines, each having, for example, a length of 100 μm, are drawn in such a manner as not to superpose pores, and then, the number of crystals of silicon carbide present on these straight lines is divided by the total length of the straight lines, thus determining the average grain size of the crystals of silicon carbide.

In the present embodiment, the protrusions 2 are formed integrally with the base part 3, and therefore, are made or the same main component as that of the base part 3. A protective layer, not shown, made of, for example, an oxide film, a resin, or glass may be formed on at least any of the top surface 5 and side surface 6 of the protrusion 2 and the first surface 4 of the base part 3. For example, in the case of the suction member 10 made of silicon carbide ceramic, if the side surface 6 is covered with an oxide film obtained by replacing at least a part of carbon forming silicon carbide with oxygen, the oxide film can suppress shedding of ceramic particles or the like. The above-described oxide film can be formed by, for example, the irradiation with a laser beam, described later. An element analysis by using, for example, an EDS method (Energy Dispersive X-ray Spectrometry) can determine whether or not the surface region is covered with the oxide film or the protective layer.

In the suction member 10, the average height of the roughness curve element of the first surface 4 may be twice or more that of the roughness curve element of the top surface 5. Moreover, the average length of the roughness curve element of the first surface 4 may be twice or more that of the roughness curve element of the top surface 5. In the above-described suction member 10, the top surface 5 can stably suck the workpiece 11 to be sucked, and furthermore, the production of particles caused by the contact of the workpiece 11 to be sucked with the top surface 5 can be reduced, thus enhancing the heat dissipation property of the first surface 4 and reducing optical reflectivity.

Additionally, the skewness of the top surface 5 may be smaller than that of the first surface 4, and furthermore, the kurtosis of the top surface 5 may be smaller than that of the first surface 4. In this case, the shape of the top surface 5 is flat with many valleys whereas the shape of the first surface 4 is sharp with many peaks, so that the workpiece 11 to be sucked can be stably sucked, and furthermore, the production of particles caused by the contact of the workpiece 11 to be sucked with the top surface 5 cars be reduced. Moreover, the heat dissipation property of the first surface 4 may be relatively excellent and its reflectivity may be relatively low. From the viewpoint of the relatively stable suction of the workpiece 11 to be sucked, the skewness of the top surface 5 may be smaller than 0 whereas the skewness of the first surface 4 may be larger than 0. From the same viewpoint, the kurtosis of the top surface 5 may be smaller than 3 whereas the kurtosis of the first surface 4 may be larger than 3.

The average height of a roughness curve element and the average length, skewness, and kurtosis of a roughness curve element (hereinafter generally referred to as surface properties) are in conformity with JIS B 0601:2001, and the surface roughness of each of the first surface 4 and the top surface 5 is measured at three or more points by using, for example, a laser microscope VK-9500 manufactured by Keyence Corporation, and then, an average of the surface properties at linear roughness measurement is obtained. Measurement is carried out under conditions where, for example, a measurement mode is a color super depth, a measurement magnification is 400 times to 1,000 times, a measurement pitch ranges from 0.05 μm to 0.20 μm, a cutoff filter λs is 2.5 μm, a cutoff filter λs is 0.08 mm, and a measurement length ranges from 100 μm to 500 μm.

Figure 4:
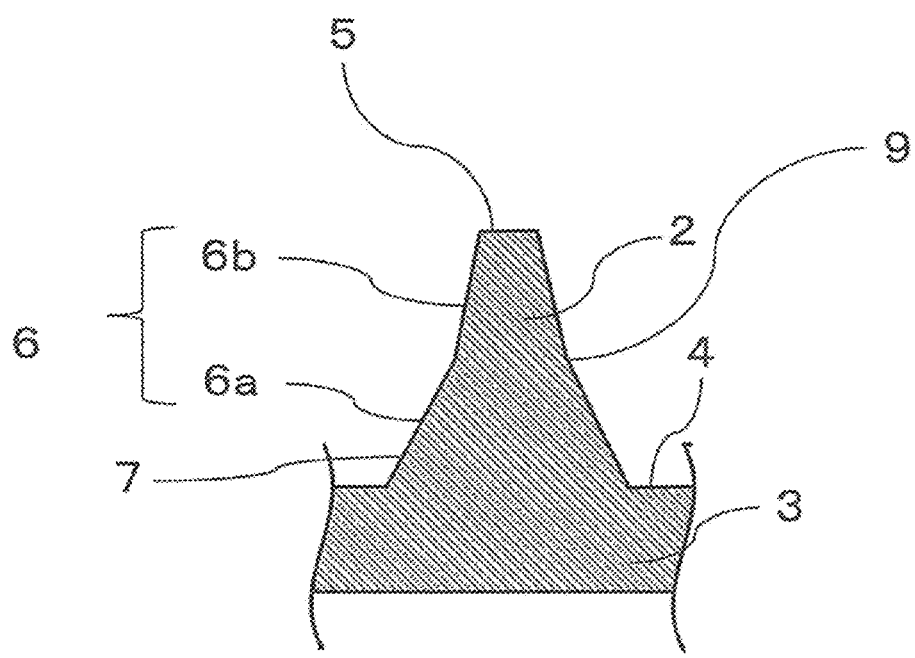
FIG. 4 is a cross-sectional view showing another example of the protrusion in the suction member according to the present disclosure.
Figure 5:
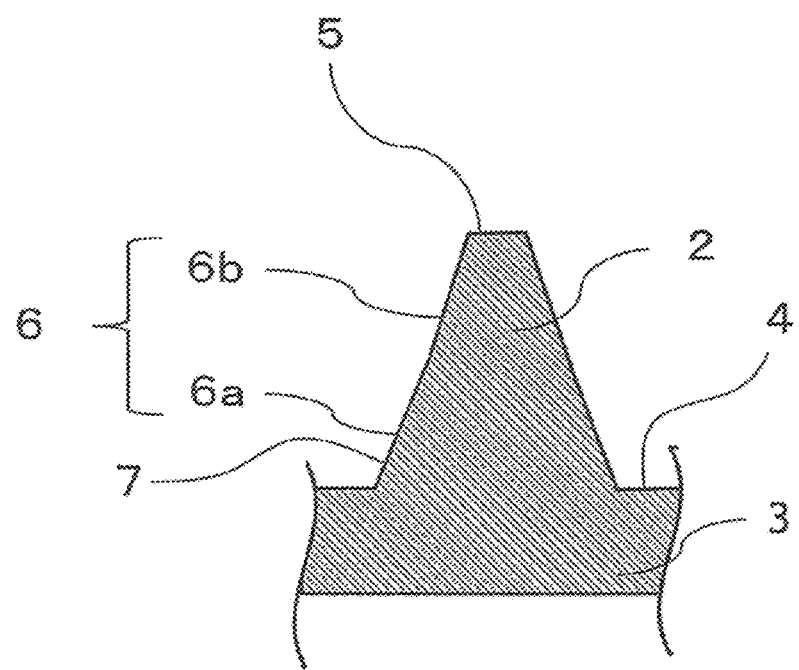
FIG. 5 is a cross-sectional view showing a further example of the protrusion in the suction member according to the present disclosure.

FIG. 4 and FIG. 5 each are cross-sectional views showing other embodiments of the suction member 10. As shown in, for example, FIG. 4, the protrusion 2 of the suction member 10 may be formed into such a shape that the area of each of the first side surface 6a near the top surface 5 and the second side surface 6b near the first surface 4 gradually decreases toward the top surface 5 in a predetermined ratio. Moreover, as shown in FIG. 5, neither the boundary 9 nor the step 61 may be provided. The shape of the protrusion 2 is not limited.

One embodiment of a fabrication method of the suction member will be described below with reference to the attached drawings.

For example, silicon carbide powder having the total ratio of 3C type and 4H type crystalline polymorphism in silicon carbide ceramic is 10% or more and 20% or less, water, and a dispersant for dispersing the silicon carbide powder are put into a ball mill together, followed by pulverizing in mixture for 40 hours to 60 hours, thus obtaining slurry. Here, the content of titanium contained in the silicon carbide powder is, for example, 160 ppm by mass or more and 400 ppm by mass or less.

Here, the average particle size (D50) of the silicon carbide pulverized in mixture is 0.4 μm or more and 3 μm or less. Next, a sintering aid containing boron carbide powder and amorphous carbon powder or a phenol resin and a binder are added in mixture, followed by spraying and draying, thus obtaining granules whose main component is silicon carbide.

Subsequently, the granules are hydrostatically molded into a disk-like mold at a pressure appropriately selected within a range from 49 MPa to 147 MPa, followed by cutting and removing unnecessary portions.

Thereafter, the mold is degreased in the nitrogen atmosphere at a temperature of 450° C. to 650° C. for a retaining time of 2 hours to 10 hours, thus obtaining a degreased material. Next, the degreased material is held and baked in a vacuum atmosphere of inactive gas at a maximum temperature of 1,800° C. to 2,200° C., more preferably, 2,100° C. to 2,200° C. for a retention time of 3 hours to 6 hours, thus obtaining a base member made of silicon carbide ceramic. Here, although the inactive gas is not particularly limited, argon gas may be used because it is easily available and can be easily handled.

Figure 6:
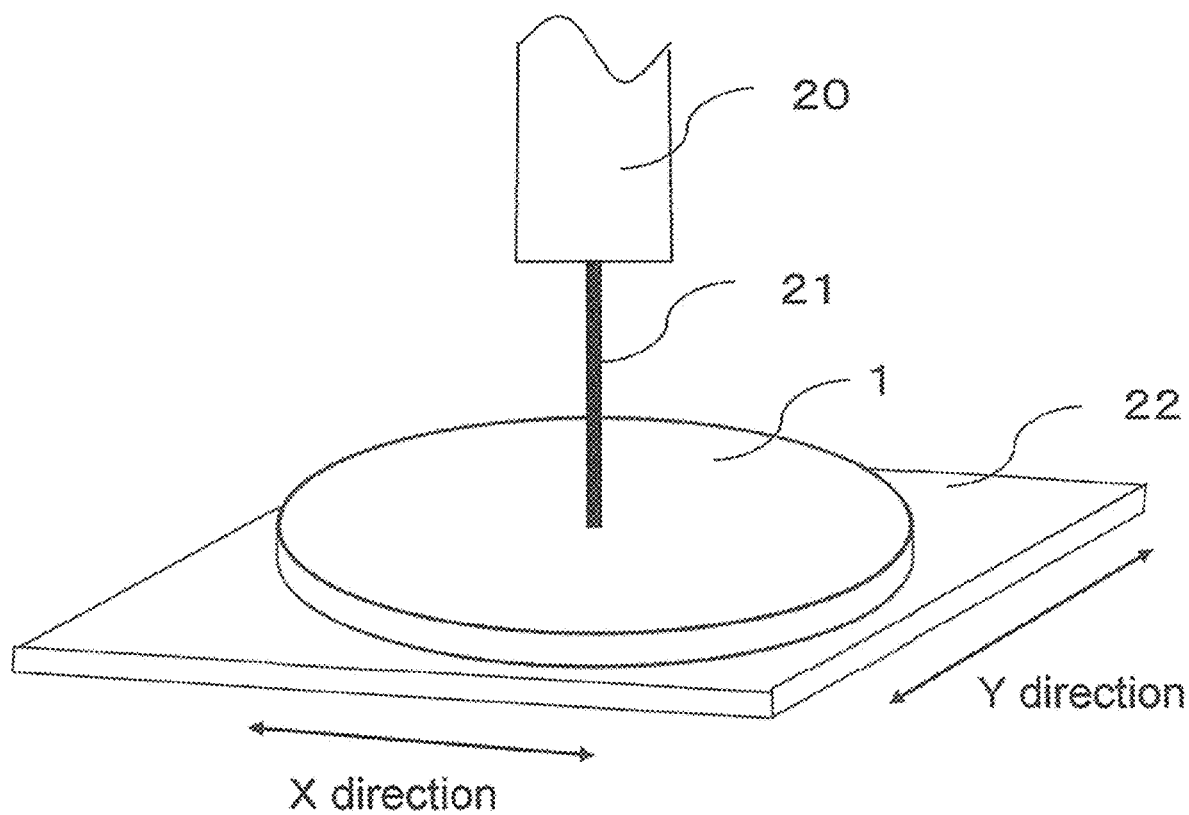
FIG. 6 is a view shoving a laser emitting method to a base member when the suction member according to the present disclosure is fabricated.

As shown in FIG. 6, the surface of the base member 1 is laser-machined by irradiating with a laser beam 21 from a laser beam source 20.

Figure 7A:
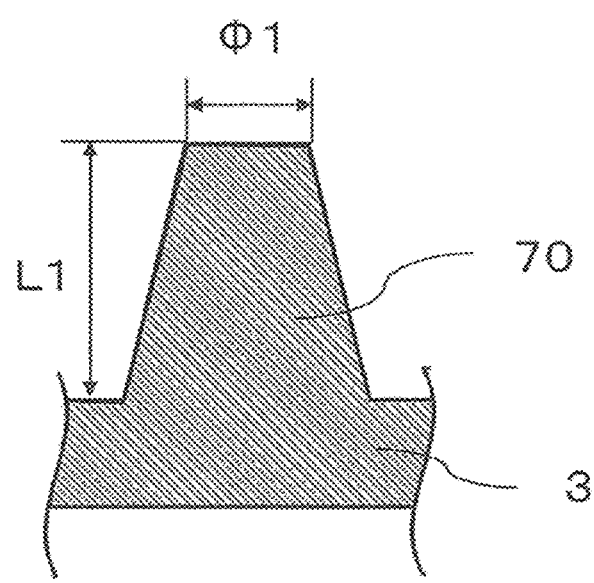
Figure 7B:
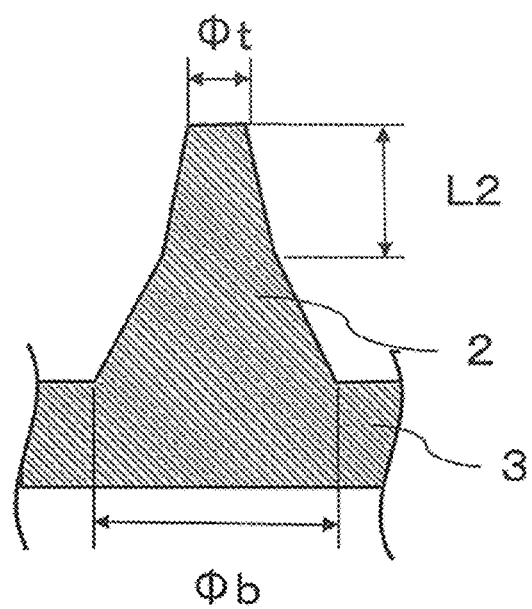

This laser machining process includes: a first machining process in which a precursor of the protrusion 2 (hereinafter also referred to as a precursor protrusion 70) shown in FIG. 7(a) is formed by irradiating the base member 1 with the laser beam 21; and a second machining process in which the protrusion 2 shown in FIG. 7(b) is obtained by irradiating the precursor protrusion 70 with the laser beam 21.

In the first machining process, a predetermined site of the base member 1 is engraved by irradiating the base member 1 with the laser beam 21. More specifically, the base member 1 is irradiated with the laser beam 21 in such a manner as to encircle a predetermined region in which the protrusion 2 is to be located, and then, the region irradiated with the laser beam 21 is removed. The first surface 4 is formed in the region irradiated with the laser beam 21 whereas a region not irradiated with the laser beam 21 remains as the precursor protrusion 70. In the first machining process, the plurality of projecting ridges 7 extending in a direction apart from the first surface 4 are formed on the entire side surface of the precursor protrusion 70.

The surface of the precursor protrusion 70 and the first surface 4 are modified regions, not shown, obtained by melting and solidifying by irradiating with the laser beam 21. The shape and properties of these surfaces may be adjusted according to the irradiation condition of the laser beam 21. Although the laser for use in machining is not particularly limited, a picosecond laser whose laser pulse width ranges in a picosecond region may be used.

The precursor protrusion 70 formed in the first machining process has a diameter Φ1 of a top surface of 100 μm to 500 μm, a height L1 of 100 μm to 1,000 μm, and about ten to a hundred of projecting ridges 7 at one periphery. In the first machining process, irradiating a desired region with the laser beam 21 is to be repeated while varying the depth of focus of the laser beam 21 until the machining depth takes a value L1. A position at the boundary irradiated with a laser beam is to be adjusted such that the boundary between the protrusion 2 and the first surface 4 is rounded.

In the second machining process, an upper portion of the precursor protrusion 70 in the drawing is selectively removed by selectively irradiating, with the laser beam 21, the upper portion of the precursor protrusion 70 formed in the first machining process, in the drawing. In the second machining process, the protrusion 2 is formed such that the outer peripheral line on a side (the first side surface 6a) nearer the top surface 5 than the boundary 9, in a plan view, is located inward of the outer peripheral line on a side (the second side surface 6b) nearer the first surface 4 than the boundary 9. In other words, the second machining process is performed such that the diameter of the protrusion 2 in the region encircled by the first side surface 6a becomes small.

In the second machining process, the side nearer the first surface 4 than the boundary 9 is not irradiated with the laser beam, and therefore, the plurality of projecting ridges 7 formed in the first machining process remain.

Upon the completion of the above-described second machining process, the protrusion 2 having, for example, a diameter Φt of the top surface of 50 μm to 200 μm, a height L1 of 100 μm to 1,000 μm, a height L2 of the portion encircled by the first side surface 6a of 50 to 300 μm is obtained. In this second machining process, if an output of a laser beam to be emitted is smaller than that of a laser beam in the first machining process, the protrusion 2 can be easily machined into a desired shape. At this time, the second machining process is preferably performed such that the number of pores formed on the first side surface 6a per unit area becomes smaller than that of pores formed on the second side surface 6b per unit area.

The side surface 6 and the first surface 4 become modified regions melted and solidified by the laser machining. That is to say, the side surface 6 and the first surface 4 are modified by the laser beam, so that the number of pores is reduced, thus forming a surface region having a smaller residual stress in comparison with a mechanically machined surface. For example, a surface region is oxidized by laser machining in an oxidation atmosphere, and thus, a coating made of silicon oxide that hardly adsorbs particles in comparison with silicon carbide, or silicon carbide in which at least a part of carbon is substituted with oxide, is formed on the side surface 6 and the first surface 4.

In these laser machining processes, the laser beam source 20 may bs moved according to a laser machining pattern. As shown in FIG. 6, the base member 1 may be placed on a stage 22, and then, the stage 22 may be moved for the purpose of machining. In the case where the stage 22 is moved, the stage 22 can be moved in a planar direction perpendicular to the laser beam 21, that is, X and Y directions, and therefore, the accuracy of the focus of the laser beam 21 in a Z direction is enhanced in comparison with the case where the laser beam source 20 is moved, and furthermore, variations of the inclination of the laser beam 21 can be suppressed. As a consequence, the accuracy of the laser machining is enhanced, thus forming the plurality of protrusions 2 with high accuracy.

The formation of the protrusions 2 by the laser machining dispenses with a mask, unlike, for example, blasting, thus improving productivity. Moreover, the shape of the protrusion 2 can be changed simply by changing a laser beam, irradiation program, and therefore, suction members 10 for various usages and apparatuses can be readily fabricated.

With the above-described method, the suction member 10 according to the present disclosure can be obtained.

EXAMPLES

Examples according to the present disclosure will be explained below. First, disk-like silicon carbide ceramic having an outer diameter of 100 mm and a thickness of 10 mm was prepared. Then, the outer peripheral surface and thickness of the silicon carbide ceramic were smoothened by cylindrical processing and grinding, respectively, followed by wrapping by the use of diamond abrasive grains having a grain size of 10 μm or less, thus obtaining the base member 1.

Next, the base member 1 was subjected to the first machining process and the second machining process, thus obtaining the suction member 10 shown in FIGS. 2(a) and 2(b).

In both of the first machining process and the second machining process, the base member 1 was irradiated with the laser beam 21 by using the laser beam source 20 having a peak wavelength of 532 nm and a spot diameter of 20 μm, and the stage 22 was moved in the X and Y directions, thus forming the protrusions 2. Incidentally, the laser beam source 20 was a picosecond laser beam source. The laser machining was carried out in the oxidation atmosphere. The laser machining formed the projecting ridges 7 on the side surface 6, and furthermore, the side surface 6 and the first surface 4 of the base part 3 were modified, thus forming the surface region in which the number of pores per unit area was small and which contained silicon carbide having a part of carbon substituted with oxygen. Moreover, scaled particles having a size substantially similar to the spot diameter of the laser beam 21 were formed on the first surface 4. Here, a laser output in the first machining process was 80 W whereas a laser output in the second machining process was 20 W.

Figure 8:
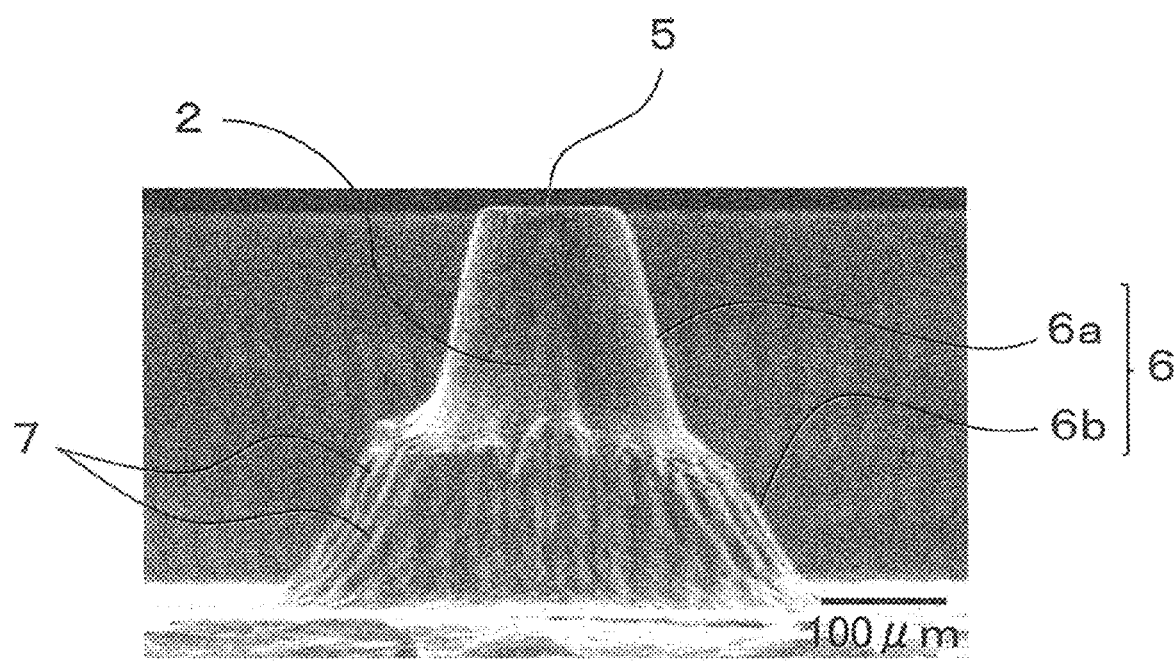
FIG. 8 is an electron micrograph illustrating one example of the protrusion in the suction member shown in FIG. 1.

The protrusions 2 formed on the suction member 10 fabricated by the above-described processes were observed by SEM. FIG. 8 is an SEM photograph illustrating an example of the suction member 10. The acceleration voltage of SEM shooting was 150 kV, and a shooting magnification was 100 times. The dimensions of each of the protrusions 2 measured based on the SEM photograph were as follows: the height L1 of the protrusion 2 was about 305 μm; the height L2 of the protrusion 2 from a bending point 9 to the top surface 5 was about 171 μm; the diameter Φt of the top surface 5 was about 103 μm; the diameter Φb of the bottom surface was about 200 mm; and the number of projecting ridges 7 was 44.

Additionally, the top surface 5 of the protrusion 2 and the first surface 4 of the base part 3 were observed by a laser microscope, and thus, the linear roughness was measured. The observation and measurement were conducted by using a laser microscope VK-9500 manufactured by Keyence Corporation. The measurement mode was the color super depth, the measurement magnification was 400 times to 1,000 times, the measurement pitch ranged from 0.05 μm to 0.20 μm; the cutoff filter λs was 2.5 μm; the cutoff filter λc was 0.08 μm; and the measurement length ranged from 100 μm to 500 μm. The measurement was carried out at three different positions in each of the X and Y directions, that is, six positions in total. An average was calculated from the resultant measurement values. The average height of the roughness curve element at the top surface 5 of the protrusion 2 was 1.57 μm; the average length of the roughness curve element was 19.52 μm; the skewness was −0.52; the kurtosis was 2.57; the average height of the roughness curve element at the first surface 4 of the base part 3 was 4.42 μm; the average length of the roughness curve element was 45.42 μm; the skewness was 0.18; and the kurtosis was 4.91.

Figure 9:
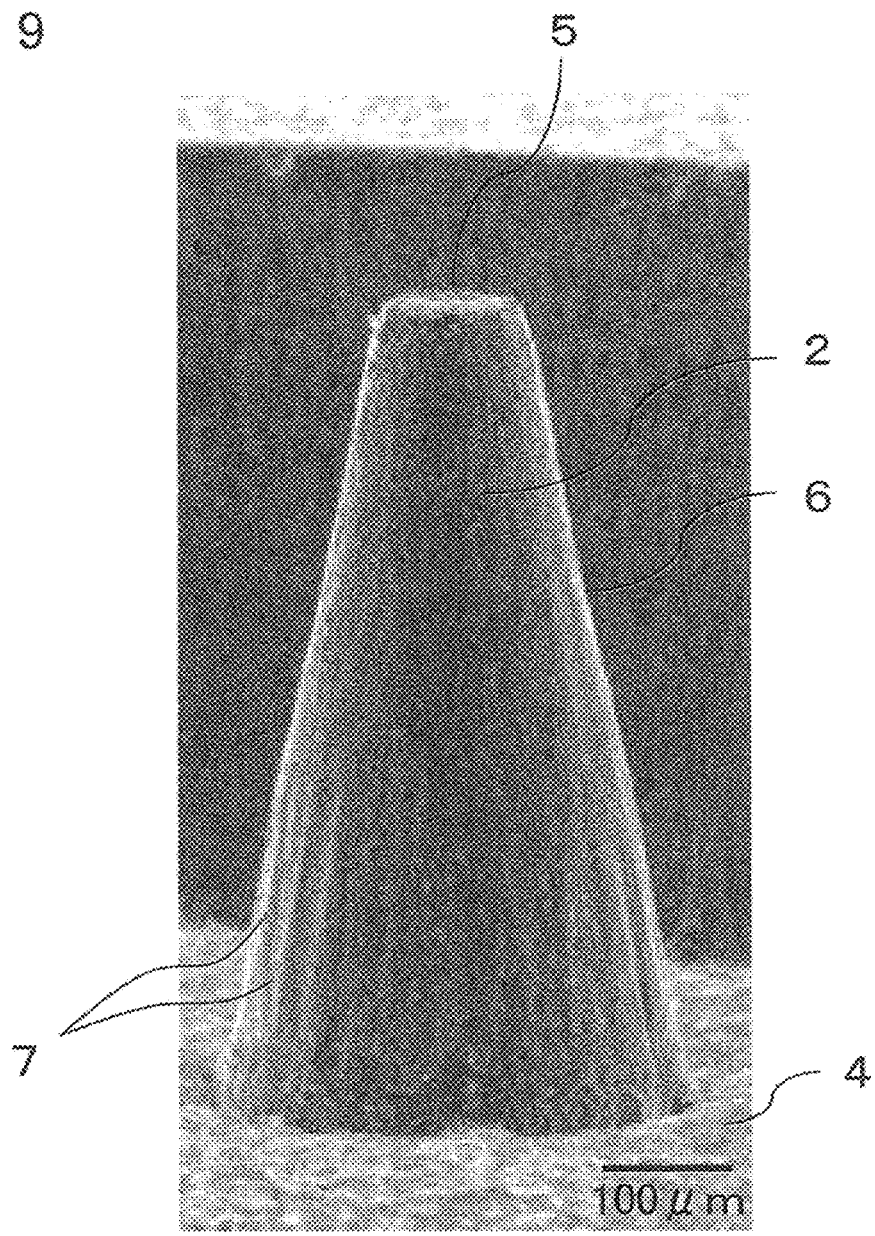
FIG. 9 is an electron micrograph illustrating another example of the protrusion in the suction member shown in FIG. 1.

FIG. 9 is an SEM photograph of the protrusion 2 fabricated under a different machining condition. A beam source was a fiber laser having a wavelength of 1064 nm, an output of 20 W, and a spot diameter of 20 μm in an oxidation atmosphere. In this example, the projecting ridges 7 were formed in such a manner as to extend toward the top surface 5 apart from a position contiguous to the first surface of the protrusion 2 without any step 61.

As shown in FIG. 8 and FIG. 9, even if the output of the laser beam source 20 was the same, whether or not the projecting ridges 7 were formed depended upon the position of the protrusion 2 because a machined state varied according to the distance from the laser beam source 20. More specifically, the projecting ridges were easily formed at a position remote from the laser beam source 20. In contrast, the projecting ridges 1 were hardly formed at a position near the laser beam source 20.

In order to form the projecting ridges 7, it is preferable that the spot diameter be increased and the movement distance of a laser beam per shot be increased. In contrast, in order to form the side surface 6 without any projecting ridges 7, it is preferable that the movement distance of a laser beam per shot be decreased.

Although the suction member according to the present disclosure has been explained above, the present disclosure is not limited to the above-described mode. Various improvements and modifications may be made within the scope not departing from the gist of the present disclosure.

DESCRIPTION OF THE REFERENCE NUMERALS

1: Base member
2: Protrusion
3: Base part
4: First surface
5: Top surface
6: Side surface
6a: First side surface
6b: Second side surface
7: Projecting ridge
8: Area of portion contiguous to first surface of protrusion
9: Boundary
10: Suction member
11: Substrate (workpiece to be sucked)
20: Laser beam source
21: Laser beam
22: Stage

The invention claimed is:

1. A suction member comprising:
a base part comprising a first surface; and
a plurality of protrusions, each of which comprises:
a side surface contiguous to the first surface of the base part, wherein the side surface comprises a plurality of projecting ridges extending in a direction away from the first surface of the base part; and
a top surface contiguous to the side surface, wherein an area of the top surface of each of the plurality of protrusions is smaller than an area of a bottom portion of each of the plurality of protrusions that is contiguous to the first surface of the base part.

2. The suction member according to claim 1, wherein each of the projecting ridges is contiguous to the first surface of the base part.

3. The suction member according to claim 1, wherein each of the plurality of protrusions further comprise:
a first side surface contiguous to the top surface and to the projecting ridges; and
a second side surface comprising the projecting ridges;
wherein a width of the first side surface is greatest at a boundary between the first side surface and the second side surface and a width of the second side surface is greater than a width of the boundary.

4. The suction member according to claim 3, wherein the first side surface has a step at a portion contiguous to the second side surface.

5. The suction member according to claim 3, wherein the width of the first side surface is gradually decreased toward the top surface.

6. The suction member according to claim 3, wherein the width of the second side surface is gradually increased toward the first surface of the base part.

7. The suction member according to claim 3, wherein a number of pores per unit area at the first side surface is smaller than a number of pores per unit area of the second side surface.

8. A suction member comprising:
a base part comprising a first surface; and
a plurality of protrusions, each of which comprises:
a side surface contiguous to the first surface of the base part, wherein the side surface comprises a plurality of projecting ridges extending in a direction away from the first surface of the base part; and
a top surface contiguous to the side surface, wherein an average height of a roughness curve element of the first surface of the base part is at least twice an average height of a roughness curve element of the top surface of each of the plurality of protrusions.

9. A suction member comprising:
a base part comprising a first surface; and
a plurality of protrusions, each of which comprises:
a side surface contiguous to the first surface of the base part, wherein the side surface comprises a plurality of projecting ridges extending in a direction away from the first surface of the base part; and
a top surface contiguous to the side surface, wherein an average length of a roughness curve element of the first surface of the base part is at least twice an average length of the roughness curve element of the top surface of each of the plurality of protrusions.

10. A suction member comprising:
a base part comprising a first surface; and
a plurality of protrusions, each of which comprises:
a side surface contiguous to the first surface of the base part, wherein the side surface comprises a plurality of projecting ridges extending in a direction away from the first surface of the base part; and a top surface contiguous to the side surface, wherein a skewness and a kurtosis of the top surface is smaller than a skewness and a kurtosis of the first surface.

11. The suction member according to claim 10, wherein the skewness of the top surface is smaller than zero, and the skewness of the first surface is greater than zero.

12. The suction member according to claim 10, wherein the kurtosis of the top surface is smaller than three, and the kurtosis of the first surface is greater than three.

13. A suction member comprising:
  a base part comprising a first surface; and
  a plurality of protrusions, each of which comprises:
    a side surface contiguous to the first surface of the base part, wherein the side surface comprises a plurality of projecting ridges extending in a direction away from the first surface of the base part; and
  a top surface contiguous to the side surface,
  wherein the base part and the plurality of protrusions comprise ceramic, wherein a main component of the ceramic is silicon carbide, and wherein a total sum of ratios of 3C type and 4H type of crystalline polymorphism of crystals of the silicon carbide is 10% to 20%.

14. A suction member comprising:
  a base part comprising a first surface; and
  a plurality of protrusions, each of which comprises:
    a side surface contiguous to the first surface of the base part, wherein the side surface comprises a plurality of projecting ridges extending in a direction away from the first surface of the base part; and
  a top surface contiguous to the side surface,
  wherein the base part and the plurality of protrusions comprise ceramic, wherein a main component of the ceramic is silicon carbide, and wherein the titanium content of the ceramic is 160 ppm by mass to 400 ppm by mass.

* * * * *